(12) United States Patent
Soma et al.

(10) Patent No.: US 8,373,494 B2
(45) Date of Patent: *Feb. 12, 2013

(54) POWER SUPPLY CONTROL CIRCUIT

(75) Inventors: Osamu Soma, Kanagawa (JP); Akihiro Nakahara, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 51 days.

This patent is subject to a terminal disclaimer.

(21) Appl. No.: 12/979,100

(22) Filed: Dec. 27, 2010

(65) Prior Publication Data

US 2011/0163794 A1  Jul. 7, 2011

(30) Foreign Application Priority Data

Jan. 4, 2010  (JP) .................................. 2010-000133

(51) Int. Cl.
*H03K 17/687*  (2006.01)
(52) U.S. Cl. ....................................... 327/427; 327/530
(58) Field of Classification Search .......... 327/108–110, 327/427, 434, 530
See application file for complete search history.

(56) References Cited

U.S. PATENT DOCUMENTS

| 6,661,260 B2* | 12/2003 | Nakahara et al. ............. 327/109 |
| 7,088,126 B2 | 8/2006 | Nakahara et al. |
| 7,741,894 B2* | 6/2010 | Kojima ......................... 327/427 |
| 2009/0160498 A1* | 6/2009 | Nakahara ...................... 327/109 |
| 2009/0160499 A1* | 6/2009 | Nakahara ...................... 327/109 |

FOREIGN PATENT DOCUMENTS

JP  2005-130245 A  5/2005

OTHER PUBLICATIONS

U.S. Appl. No. 12/979,102, filed Dec. 27, 2010, Osamu Soma et al.
USPTO Notice of Allowance, U.S. Appl. No. 12/979,102, Apr. 17, 2012, 10 pages.

* cited by examiner

*Primary Examiner* — Quan Tra
(74) *Attorney, Agent, or Firm* — Foley & Lardner LLP

(57) ABSTRACT

A power supply control circuit comprises an output transistor which controls supply of electric power to a load and a gate driving circuit which generates control signals "a" and "b" for controlling on/off of the output transistor 32 based on an external input signal. A transistor 37 discharges a gate charge of the output transistor based on the control signals "a" and "b", when turning off the output transistor. A transistor 39 discharges more slowly than the transistor. A diode is coupled to the transistor 37 in series and which cuts off a discharge path through the transistor 37 transistor and the diode when the gate voltage of the output transistor falls to a voltage level higher than the sum of the power supply voltage Vcc and a threshold voltage of the output transistor, at a time of turning off the output transistor.

8 Claims, 8 Drawing Sheets

POWER SUPPLY CONTROL CIRCUIT

CROSS REFERENCES TO RELATED APPLICATIONS

The disclosure of Japanese Patent Application No. 2010-133 filed on Jan. 4, 2010 including the specification, drawings and abstract is incorporated herein by reference in its entirety.

BACKGROUND

1. Field of the Invention

The present invention relates to a power supply control circuit, especially to a power supply control circuit which possesses an output transistor for controlling power supply to a load.

2. Description of Related Art

A power supply control circuit is known as a circuit which controls electric power supplied from a power source to a load. As one of the application areas, the power supply control circuit is used to drive an actuator and a lamp of an automobile.

The power supply control circuit comprises an output transistor serving as a switch which switches whether or not to supply electric power from a power source to a load. For example, an N-channel MOS transistor is used as an output transistor for a high-side switch. When driving the output transistor into an on state, it is necessary to make an on-resistance small enough by applying voltage higher than the power supply voltage to a gate of the output transistor. On the other hand, when driving the output transistor into an off state, it is necessary to discharge a charge stored at the gate thereof. However, in order to suppress a noise at the time of switching, severe restrictions are provided on a turn-off time and a slew rate.

FIG. 7 illustrates a circuit diagram of a semiconductor output circuit (a power supply control circuit) 100 disclosed by Japanese Patent Laid-open No. 2005-130245 and its counterpart U.S. Pat. No. 7,088,126 B2. As illustrated in FIG. 7, the power supply control circuit 100 comprises a gate driving circuit 131, an output transistor 132, a discharge circuit 133, a voltage detector 134, and a discharge circuit 135. The circuit configuration of the power supply control circuit 100 is explained in detail in the description of Japanese Patent Laid-open No. 2005-130245 and U.S. Pat. No. 7,088,126 B2; therefore, the explanation thereof is omitted here. FIG. 8 is a timing chart for explaining operation of the power supply control circuit 100 illustrated in FIG. 7. In FIG. 8, the vertical axis indicates voltage and current and the horizontal axis indicates time.

With reference to FIGS. 7 and 8, operation of the power supply control circuit 100 is explained. First, at time t1, an input signal "in" and a control signal "a" shift from a high level (for example, a power supply voltage Vcc) to a low level (for example, a ground voltage GND). Concurrently, a control signal "b" shifts from a low level to a voltage higher than the power supply voltage Vcc (for example, Vcc+10V). At time t2, a gate voltage G of the output transistor 132 shifts from a low level to a voltage higher than the power supply voltage Vcc (for example, Vcc+10V). Thereby, the output transistor 132 is brought to an on state. Accordingly, the power supply control circuit 100 supplies electric power from the power source to an output terminal To. At this time, an output voltage Vo of the output terminal To is raised to substantially the same voltage level as the power supply voltage Vcc. This output voltage Vo is supplied to a load (not shown) of the next stage. A charge corresponding to the output voltage Vo is charged in a capacitor 136 via a parasitic diode of an NMOS transistor 138. Since a voltage of the control signal "c" is set to the same voltage level as the output voltage Vo, an NMOS transistor 137 is brought to an off state.

At time t3, the input signal "in" and the control signal "a" shift from a low level to a high level (the power supply voltage Vcc). Concurrently, in the gate driving circuit 131, the terminal which outputs the control signal "b" becomes in a high-impedance state. At this time, a depletion-type NMOS transistor 139 is brought to an on state. Therefore, a gate charge of the output transistor 132 is slowly discharged via a current limiting element 140 and the NMOS transistor 139.

Furthermore, at time t3, a voltage of the control signal "c" becomes a voltage level given by superposing the output voltage Vo to the voltage of the control signal "a." Therefore, the NMOS transistor 137 is brought to an on state. Accordingly, the gate charge of the output transistor 132 is discharged at high speed via the NMOS transistor 137.

At time t4 after a delay time td from time t3, when the gate voltage G falls to the same voltage level as the power supply voltage Vcc, the output voltage Vo begins to fall. At time t5, when the output voltage Vo becomes lower than the power supply voltage Vcc by a threshold voltage "h" of the NMOS transistor 138, the NMOS transistor 138 is brought to an on state. Thereby, the NMOS transistor 137 is brought to an off state. That is, the gate charge of the output transistor 132 is no longer discharged via the NMOS transistor 137. On the other hand, the slow discharge through the NMOS transistor 139 is continued. At time t6, when the discharge is completed and the gate voltage G is set to a low level, the output voltage Vo also becomes a low level. When a load (not shown) coupled to the output terminal To is a resistive device, an output current Io exhibits the same change as the output voltage Vo, as illustrated in FIG. 8.

In this way, in switching the output transistor 132 from an on state to an off state, when the output voltage Vo is as high as the power supply voltage Vcc, the NMOS transistor 137 is brought to an on state. Accordingly, the gate charge of the output transistor 132 is discharged at high speed. After that, when the output voltage Vo becomes lower than the power supply voltage Vcc by the threshold voltage of the NMOS transistor 138, the NMOS transistor 137 is brought to an off state. Accordingly, the gate charge of the output transistor 132 is no longer discharged at high speed.

On the other hand, in switching the output transistor 132 from an on state to an off state, the NMOS transistor 139 is brought to an on state by the control signal "a" at a low level. Accordingly, the gate charge of the output transistor 132 continues being discharged via the current limiting element 140 and the transistor 139, more slowly than via the NMOS transistor 137.

That is, it is possible for the power supply control circuit 100 to shorten time (delay time td) after starting the turn-off operation (time t3) until the output voltage Vo starts changing (time t4), by performing discharge operation using the two discharge paths as described above. That is, the turn-off time (from time t3 to time t6) can be shortened. At the same time, it is possible for the power supply control circuit 100 to make slow a slew rate of the output voltage Vo in the turn-off operation.

SUMMARY

FIG. 6 illustrates characteristics of on-resistance vs. gate-to-source voltage of an output transistor. In FIG. 6, the vertical axis indicates the on-resistance and the horizontal axis indicates the gate-to-source voltage. As illustrated in FIG. 6, it is necessary to increase the gate voltage sufficiently in order to make an on-resistance small enough. However, in switching (turning off) the output transistor from an on state to an off state, if the gate voltage is high, discharge of a gate charge takes long time. Therefore, it is difficult to satisfy restrictions on the off time. When the gate charge is discharged at high speed, on the other hand, a slew rate of an output voltage (Vo) becomes large; accordingly, a switching noise becomes large.

Japanese Patent Laid-open No. 2005-130245 and U.S. Pat. No. 7,088,126 B2 is proposed in order to solve such a problem. However, in the case of the previously existing technology, a high-speed electric discharge by means of the discharge circuit 133 is performed until the output voltage Vo becomes lower than the power supply voltage Vcc by the threshold voltage "h" of the NMOS transistor 138. Accordingly, in the case of the previously existing technology, as illustrated at time t5 of FIG. 8, at the time of a turn-off, distortion occurs in the waveform of the output voltage Vo, causing a problem. Therefore, the power supply control circuit of the previously existing technology had the problem that a noise is produced in the output voltage.

The present invention has been made in view of the above circumstances. A power supply control circuit according to the present invention comprises an output transistor of an N-channel type which is provided between a power supply line and an output terminal and controls supply of electric power to a load and a gate driving circuit which generates a control signal for controlling on/off of the output transistor based on an external input signal. A first discharge switch is provided between a gate and a source of the output transistor and, when turning off the output transistor, discharges a charge stored in the gate of the output transistor based on the control signal. A second discharge switch is provided between the gate and the source of the output transistor and, when turning off the output transistor, discharges a charge stored in the gate of the output transistor more slowly than the first discharge switch based on the control signal. A discharge cutoff circuit which is coupled to the first discharge switch in series and, in the case of turning off the output transistor, cuts off discharging a charge stored in the gate of the output transistor, when a gate voltage of the output transistor falls to a prescribed voltage level which is larger than the sum of the voltage of the power supply line and the threshold voltage of the output transistor.

A noise of an output voltage can be suppressed by the above circuit configuration.

According to the present invention, a power supply control circuit which is able to suppress a noise of an output voltage can be provided.

BRIEF DESCRIPTION OF THE DRAWINGS

The present invention will become fully understood from the detailed description given hereinafter and the accompanying drawings, wherein.

DETAILED DESCRIPTION OF THE PREFERRED EMBODIMENTS

Hereinafter, with reference to the accompanying drawings, the concrete embodiments to which the present invention is applied are explained in detail. For clarification of explanation, duplicated explanation will be omitted according to a case.

First Embodiment

Figure 1:
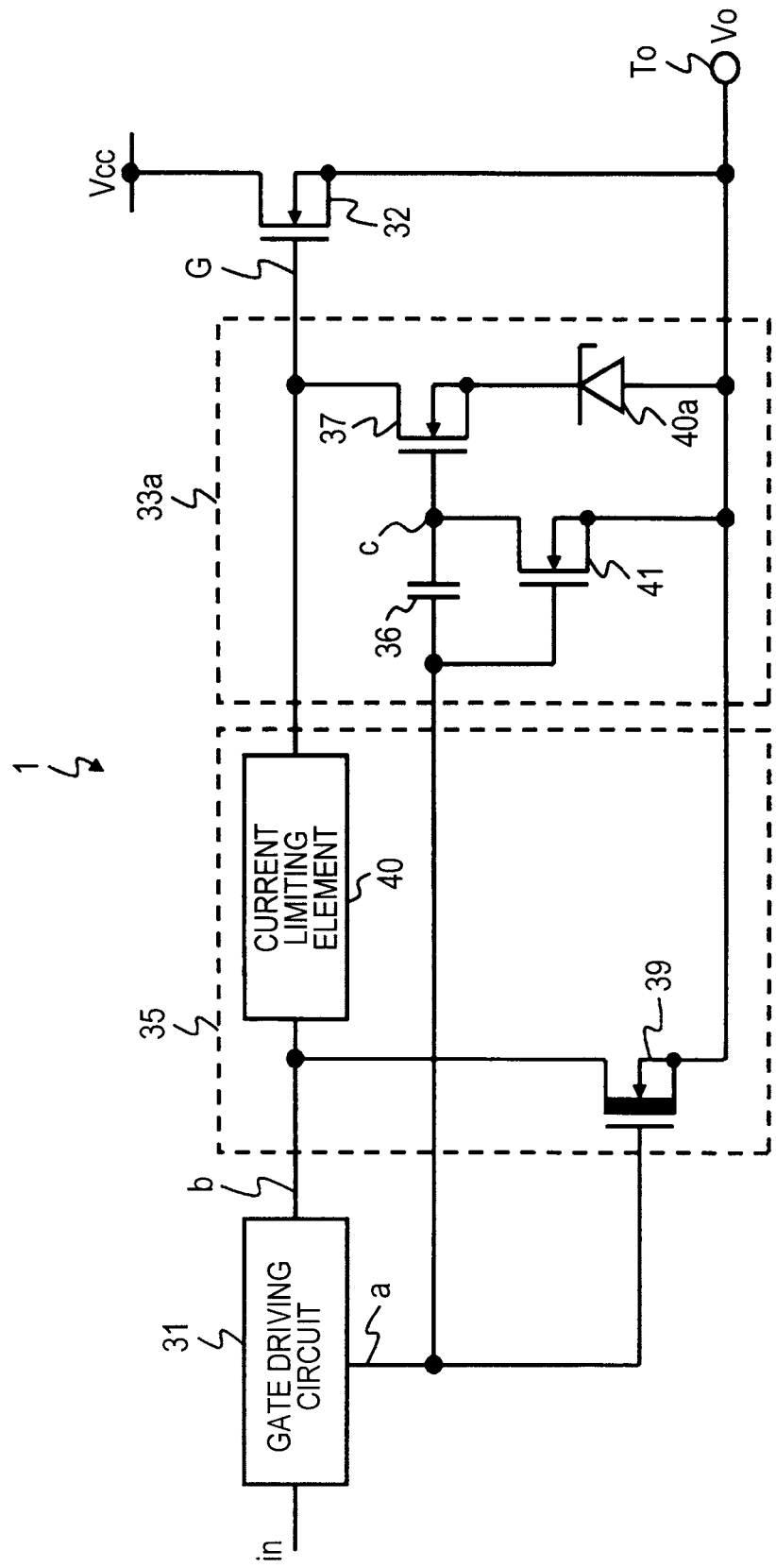
FIG. 1 is a drawing illustrating a power supply control circuit according to a first embodiment of the present invention.

FIG. 1 illustrates a circuit diagram of a power supply control circuit 1 according to a first embodiment of the present invention. The power supply control circuit 1 illustrated in FIG. 1 comprises a gate driving circuit 31, an output transistor 32, a discharge circuit 33a, and a discharge circuit 35. The discharge circuit 33a comprises a transistor (a first discharge switch) 37, a discharge cutoff circuit 40a, a capacitor 36, and a transistor 41. The discharge circuit 35 comprises a current limiting element 40 and a transistor (a second discharge switch) 39. The output transistor 32 and the transistors 37 and 41 are N-channel MOS transistors. The transistor 39 is a depletion-type N-channel MOS transistor. A Zener diode 40a is used as the discharge cutoff circuit 40a. The capacitor 36 and the transistor 41 form a bootstrap circuit.

As for the gate driving circuit 31, an input terminal is coupled to an external input terminal "in," one output terminal is coupled to a gate of the transistor 39, a gate of the transistor 41, and one terminal of the capacitor 36. Another output terminal is coupled to one terminal of the current limiting element 40. As for the transistor 39, a drain is coupled to the one terminal of the current limiting element 40, and a source is coupled to a source of the output transistor 32. As for the output transistor 32, a drain is coupled to a power supply voltage terminal (power supply line) Vcc, a gate is coupled to another terminal of the current limiting element 40, and a source is coupled to an external output terminal (output terminal) To. As for the transistor 37, a drain is coupled to the gate of the output transistor 32, a source is coupled to a cathode of the Zener diode 40a, and a gate is coupled to another terminal of the capacitor 36. An anode of the Zener diode 40a is coupled to the source of the output transistor 32. As for the transistor 41, a drain is coupled to the gate of the transistor 37 and a source is coupled to the source of the output transistor 32. For convenience, the signs "Vcc" and "in" indicate the respective terminal names, and at the same time, they indicate a power supply voltage and an input signal as well.

The gate driving circuit 31 generates control signals "a" and "b", based on an input signal (external input signal) "in" supplied from the exterior via the input terminal "in."

To be more specific, the gate driving circuit 31 generates the control signal "a" of a low level based on the input signal "in" of a low level, and outputs it to the gate of the transistor 39, the gate of the transistor 41, and the one terminal of the capacitor 36. Concurrently, the gate driving circuit 31 generates the control signal "b" of a high level having a voltage level higher than the power supply voltage Vcc, and outputs it to the gate of the output transistor 32 via the current limiting element 40. At this time, the gate driving circuit 31 steps up the voltage of the control signal "b" by a charge pump circuit (not shown) provided in the interior thereof.

On the other hand, the gate driving circuit 31 generates the control signal "a" of a high level based on the input signal "in" of a high level, and outputs it to the gate of the transistor 39, the gate of transistor 41, and the one terminal of the capacitor 36. Concurrently, the gate driving circuit 31 sets the output terminal (the another output terminal) which outputs the control signal "b", to a high-impedance state.

On/off of the output transistor 32 is controlled by a voltage applied to the gate (hereinafter, the voltage is called as a gate voltage G). For example, the output transistor 32 is controlled to an on state by the control signal "b" of a high level. Accordingly, the power supply control circuit 1 supplies electric power from the power supply voltage terminal Vcc to the external output terminal To. This electric power is supplied to a load (not shown) of the subsequent stage. At this time, the voltage (output voltage Vo) of the external output terminal To is raised to substantially the same voltage level as the power supply voltage Vcc.

The output transistor 32 is controlled to an off state by discharging a gate charge via the discharge circuits 33a and 35. Accordingly, the power supply control circuit 1 stops the supply of the electric power from the power supply voltage terminal Vcc to the external output terminal To.

The discharge circuit 33a forms a first discharge path which electrically couples the gate and the source of the output transistor 32, when switching (turning off) the output transistor 32 from an on state to an off state. That is, the first discharge path is formed between the gate and the source of the output transistor 32 via the transistor 37 and the Zener diode 40a. On/off of the transistor 37 is controlled by the control signal "c" which is generated by the bootstrap circuit. More specifically, the on/off of the transistor 37 is controlled by the voltage of the another terminal of the capacitor 36. On/off of the Zener diode 40a is controlled by the gate-to-source voltage of the output transistor 32.

For example, when switching (turning on) the output transistor 32 from an off state to an on state, the transistor 41 is controlled to an off state by the control signal "a" of a low level. However, since a parasitic diode (not shown) is formed in the transistor 41, a charge corresponding to the output voltage Vo is supplied to the capacitor 36 from the external output terminal To. The transistor 37 is controlled to an off state, since the voltage of the gate and the voltage of the source becomes almost equal. That is, when turning on the output transistor 32, the first discharge path is cut off.

On the other hand, when turning off the output transistor 32, the transistor 41 is maintained in an off state, since the control signal "a" of a high level is applied to the gate and the output voltage Vo is applied to the source. At this time, the voltage of the control signal "c" becomes a voltage level given by superposing the output voltage Vo to the voltage of the control signal "a." Thereby, the transistor 37 is brought to an on state. Here, when the gate-to-source voltage of the output transistor 32 is higher than a breakdown voltage of the Zener diode 40a, the first discharge path becomes in a conductive state. Thereby, a gate charge of the output transistor 32 is discharged via the first discharge path. On the other hand, when the gate-to-source voltage of the output transistor 32 is lower than the breakdown voltage of the Zener diode 40a, the first discharge path is cut off. Thereby, a gate charge of the output transistor 32 is no longer discharged via the first discharge path. The first discharge path discharges the gate charge of the output transistor 32 more quickly than the second discharge path to be described later. In the present embodiment, the breakdown voltage of the Zener diode 40a is set to about 6 V for which manufacturing tolerance is small and temperature dependence is also small.

When the output voltage Vo becomes lower than the power supply voltage Vcc by the threshold voltage of the transistor 41, the transistor 41 changes from an off state to an on state. Thereby, a charge stored in the capacitor 36 is discharged towards the output terminal To. Then, the voltage of the control signal "c" becomes nearly equal to the output voltage Vo. Although the transistor 37 is brought to an off state at this time, the first discharge path is already cut off by the Zener diode 40a.

The discharge circuit 35 forms a second discharge path which electrically couples the gate and the source of the output transistor 32, when turning off the output transistor 32. That is, the second discharge path between the gate and the source of the output transistor 32 is formed via the current limiting element 40 and the transistor 39. On/off of the transistor 39 is controlled by the control signal "a." The current limiting element 40 comprises a resistor, for example, and limits current which flows through the transistor 39.

For example, when turning on the output transistor 32, the transistor 39 is controlled to an off state by the control signal "a" of a low level. On the other hand, when turning off the output transistor 32, the transistor 39 is controlled to an on state by the control signal "a" of a high level. In the present embodiment, the second discharge path discharges a gate charge of the output transistor 32 more slowly than the first discharge path.

Figure 2:
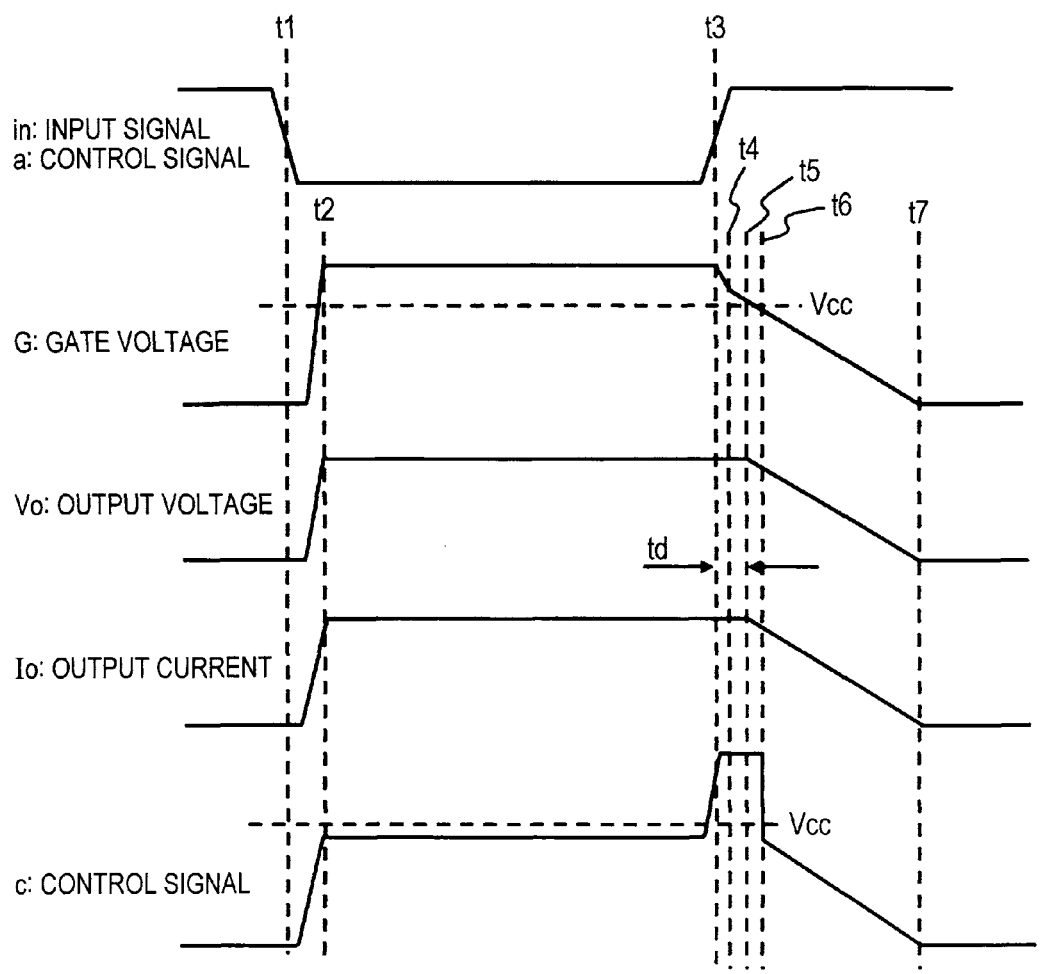
FIG. 2 is a timing chart illustrating operation of the power supply control circuit according to the first embodiment of the present invention.

Next, operation of the circuit illustrated in FIG. 1 is explained still more concretely using FIG. 2. FIG. 2 is a timing chart illustrating operation of the power supply control circuit 1 according to the present embodiment. In FIG. 2, the vertical axis indicates voltage and current and the horizontal axis indicates time.

First, at time t1, turn-on operation of the output transistor 32 starts. That is, the input signal "in" shifts from a high level (for example, the power supply voltage Vcc) to a low level (for example, the ground voltage GND). Thereby, the control signal "a" shifts from a high level to a low level. Concurrently, the control signal "b" shifts from a low level to a voltage higher than the power supply voltage Vcc (for example, the power supply voltage Vcc+10 V).

At time t2, the gate voltage G of the output transistor 32 shifts from a low level to a voltage higher than the power supply voltage Vcc. (for example, the power supply voltage Vcc+10 V). Thereby, the output transistor 32 is brought to an on state. Accordingly, the power supply control circuit 1 supplies electric power from the power supply voltage terminal Vcc to the external output terminal To. Accordingly, the output voltage Vo is raised to substantially the same voltage level as the power supply voltage Vcc. At this time, the transistor 41 is controlled to an off state by the control signal "a" of a low level. However, since a parasitic diode (not shown) is formed in the transistor 41, a charge corresponding to the output voltage Vo is supplied to the capacitor 36 from the external output terminal To. The transistor 37 is brought to an off state, since the voltage of the gate and the voltage of the source become almost equal.

Next, at time t3, turn-off operation of the output transistor 32 starts. That is, the input signal "in" shifts from a low level to a high level. Thereby, the control signal "a" shifts from a low level to a high level. Concurrently, the output terminal (the another output terminal) of the gate driving circuit 31 which outputs the control signal "b" is set to a high-impedance state.

The transistor 41 is maintained in an off state, since the control signal "a" of a high level is applied to the gate and the output voltage Vo is applied to the source. At this time, the voltage of the control signal "c" becomes a voltage level given by superposing the output voltage Vo to the voltage of the control signal "a." Thereby, the transistor 37 is brought to an on state. Accordingly, a gate charge of the output transistor 32 is discharged at high speed via the transistor 37 and the Zener diode 40a. That is, the gate charge of the output transistor 32 is discharged at high speed via the first discharge path.

The transistor 39 is brought to an on state, since the control signal "a" of a high level is applied to the gate and the output voltage Vo is applied to the source, thereby, the gate charge of the output transistor 32 is also discharged via the current limiting element 40 and the transistor 39. That is, the gate charge of the output transistor 32 is discharged via the second discharge path in addition to the first discharge path.

At time t4, when the gate voltage G falls to the power supply voltage Vcc+6 V, the first discharge path is cut off. After time t4, the gate charge of the output transistor 32 is slowly discharged only via the second discharge path. After that, when the gate voltage of the output transistor 32 further falls, the output voltage Vo begins to fall at time t5 after a delay time td from time t3.

At time t6, when the output voltage Vo becomes lower than the power supply voltage Vcc by the threshold voltage of the transistor 41, the transistor 41 is brought to an on state from an off state. Thereby, a charge stored in the capacitor 36 is discharged towards the output terminal To. Then, the voltage of the control signal "c" becomes nearly equal to the output voltage Vo. Thereby the transistor 37 is brought to an off state, and the first discharge path is already cut off by the Zener diode 40a.

At time t7, when the discharge is completed and the gate voltage G is set to a low level, the output transistor 32 is brought to an off state. Thereby, the output voltage Vo is set to a low level. When a load (not shown) coupled to the output terminal To is a resistive device, an output current Io exhibits the same change as the output voltage Vo, as illustrated in FIG. 2.

In this way, at the time of a turn-off, the power supply control circuit 1 discharges the gate charge of the output transistor 32 at high speed via the first and the second discharge path, when the gate voltage of the output transistor 32 is sufficiently higher than the power supply voltage Vcc (for example, the power supply voltage Vcc+10V). Then, at the time of a turn-off, when the gate voltage of the output transistor 32 falls to a voltage high than the power supply voltage Vcc by about 6 V, the power supply control circuit 1 cuts off the first discharge path and discharges the gate charge of the output transistor 32 slowly only via the second discharge path.

According to such a circuit configuration, it is possible for the power supply control circuit 1 to shorten the time (delay time td) after starting the turn-off operation (time t3) until the output voltage Vo starts to change (time t5), even when the gate voltage of the output transistor 32 is elevated to a voltage sufficiently higher than the power supply voltage Vcc. That is, the turn-off time (from time t3 to time t7) can be shortened. Here, the power supply control circuit 1 cuts off the first discharge path, before the output voltage Vo becomes lower than the power supply voltage Vcc. Accordingly, in the power supply control circuit 1, distortion does not occur in a waveform of the output voltage Vo, in contrast to the previously existing technology. Thereby, it is possible for the power supply control circuit 1 to suppress a noise of the output voltage Vo. At the same time, it is possible for the power supply control circuit 1 to make small a slew rate of the output voltage Vo in the turn-off operation.

Second Embodiment

Figure 3:
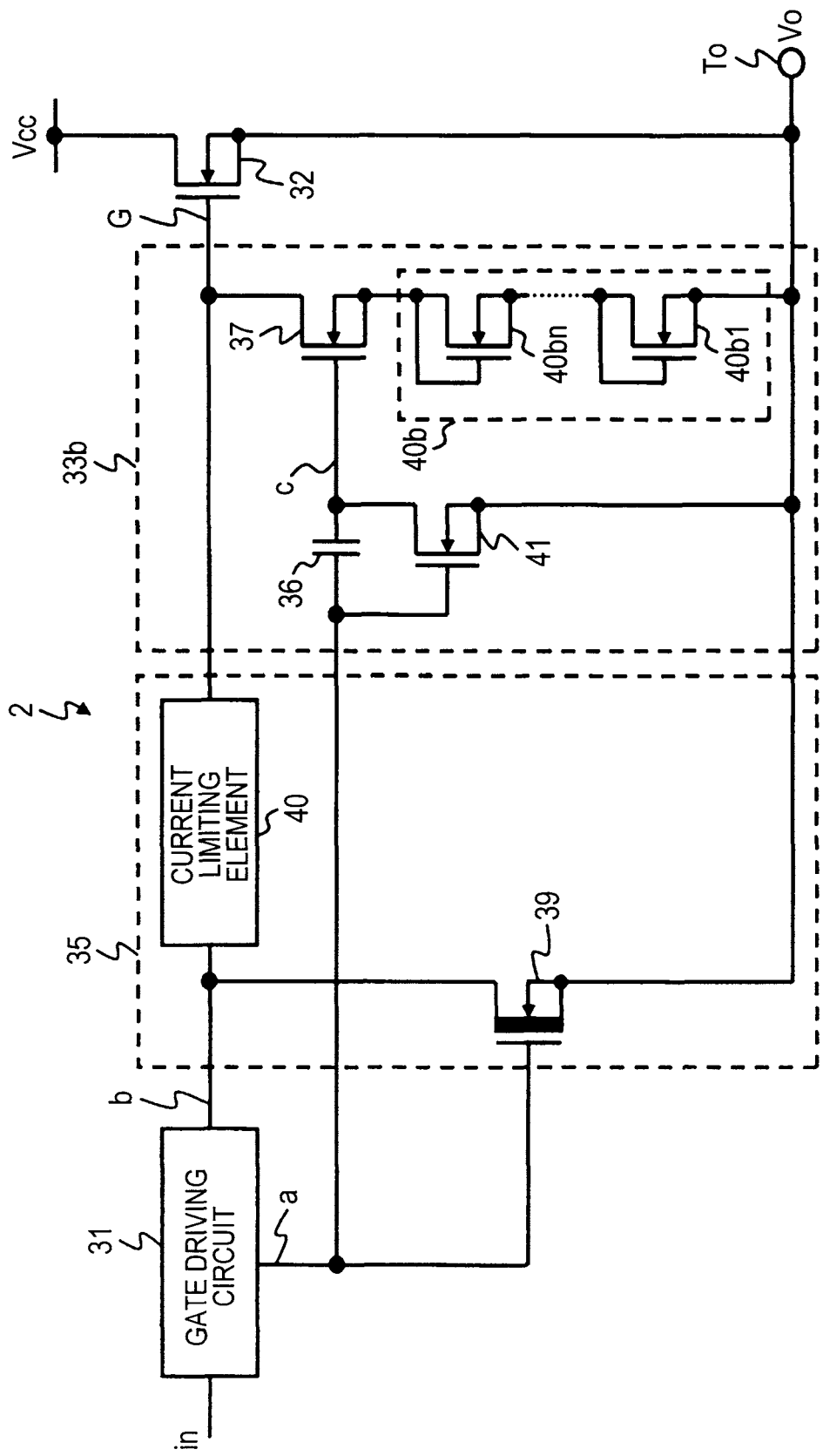
FIG. 3 is a drawing illustrating a power supply control circuit according to a second embodiment of the present invention.

FIG. 3 illustrates a circuit diagram of a power supply control circuit 2 according to a second embodiment of the present invention. As compared with the power supply control circuit 1 illustrated in FIG. 1, the power supply control circuit 2 illustrated in FIG. 3 comprises a discharge circuit 33b instead of the discharge circuit 33a. The discharge circuit 33b comprises a transistor 37, a discharge cutoff circuit 40b, a capacitor 36, and a transistor 41. The discharge cutoff circuit 40b comprises plural N-channel MOS transistors 40b1-40bn (n is a natural number), in each of which a gate and a drain are coupled in common. The transistors 40b1-40bn are coupled in series between a source of the transistor 37 and a source of the output transistor 32. The other circuit configuration is the same as that of the circuit illustrated in FIG. 1; therefore, the explanation thereof is omitted.

The power supply control circuit 1 illustrated in FIG. 1 cuts off the first discharge path at the time of a turn-off when the gate voltage G of the output transistor 32 falls to a voltage of the power supply voltage Vcc+6 V. On the other hand, the power supply control circuit 2 illustrated in FIG. 3 can cut off the first discharge path at the time of a turn-off when the gate voltage G of the output transistor 32 falls further to the neighborhood of the power supply voltage Vcc. That is, the power supply control circuit 2 can increase percentage that a period between time t3 and time t4 occupies among the turn-off time (time t3-time t7) of FIG. 2. Thereby, the power supply control circuit 2 can shorten the turn-off time as compared with the case of the first embodiment.

Operation of the power supply control circuit 2 illustrated in FIG. 3 is explained using FIG. 2. At time t3, turn-off operation of the output transistor 32 starts. That is, the input signal "in" shifts from a low level to a high level. Thereby, the control signal "a" shifts from a low level to a high level. Concurrently, the output terminal (the another output terminal) of the gate driving circuit 31 which outputs the control signal "b" is set to a high-impedance state.

The transistor 41 is maintained in an off state, since the control signal "a" of a high level is applied to the gate and the output voltage Vo is applied to the source. At this time, the voltage of the control signal "c" becomes a voltage level given by superposing the output voltage Vo to the voltage of the control signal "a." Thereby, the transistor 37 is brought to an on state. Thereby, a gate charge of the output transistor 32 is discharged at high speed via the transistor 37 and the discharge cutoff circuit 40b. That is, the gate charge of the output transistor 32 is discharged at high speed via the first discharge path.

When the gate voltage G of the output transistor 32 falls nearly to a sum total of the power supply voltage Vcc and threshold voltages of the transistors 40b1-40bn, the transistors 40b1-40bn are brought to an off state, and the first discharge path is cut off. Here, the sum total of the threshold voltages of the transistors 40b1-40bn is set up slightly higher than the threshold voltage of the output transistor 32. Thereby, the power supply control circuit 2 can cut off the first discharge path, before the output voltage Vo becomes lower than the power supply voltage Vcc. Accordingly, in the power supply control circuit 2, distortion does not occur in a waveform of the output voltage Vo, as is the case with the first embodiment. That is, it is possible for the power supply control circuit 2 to suppress a noise of the output voltage Vo. At the same time, it is possible for the power supply control circuit 2 to make small a slew rate of the output voltage Vo at the time of a turn-off. The other operations are the same as those of the case of the first embodiment; therefore, the explanation thereof is omitted.

A case where the discharge cutoff circuit 40b comprises two transistors 40b1 and 40b2 (n=2) for example, is explained. Each of the transistors 40b1 and 40b2 possesses a threshold voltage of about 2 V. In the present example, when the gate voltage G of the output transistor 32 falls to about the power supply voltage Vcc+4 V at the time of a turn-off, the first discharge path is cut off. In this way, in the present embodiment, when the gate voltage G of the output transistor 32 falls further to the neighborhood of the power supply voltage Vcc, as compared with Embodiment 1, the first discharge path can be cut off.

Third Embodiment

Figure 4:
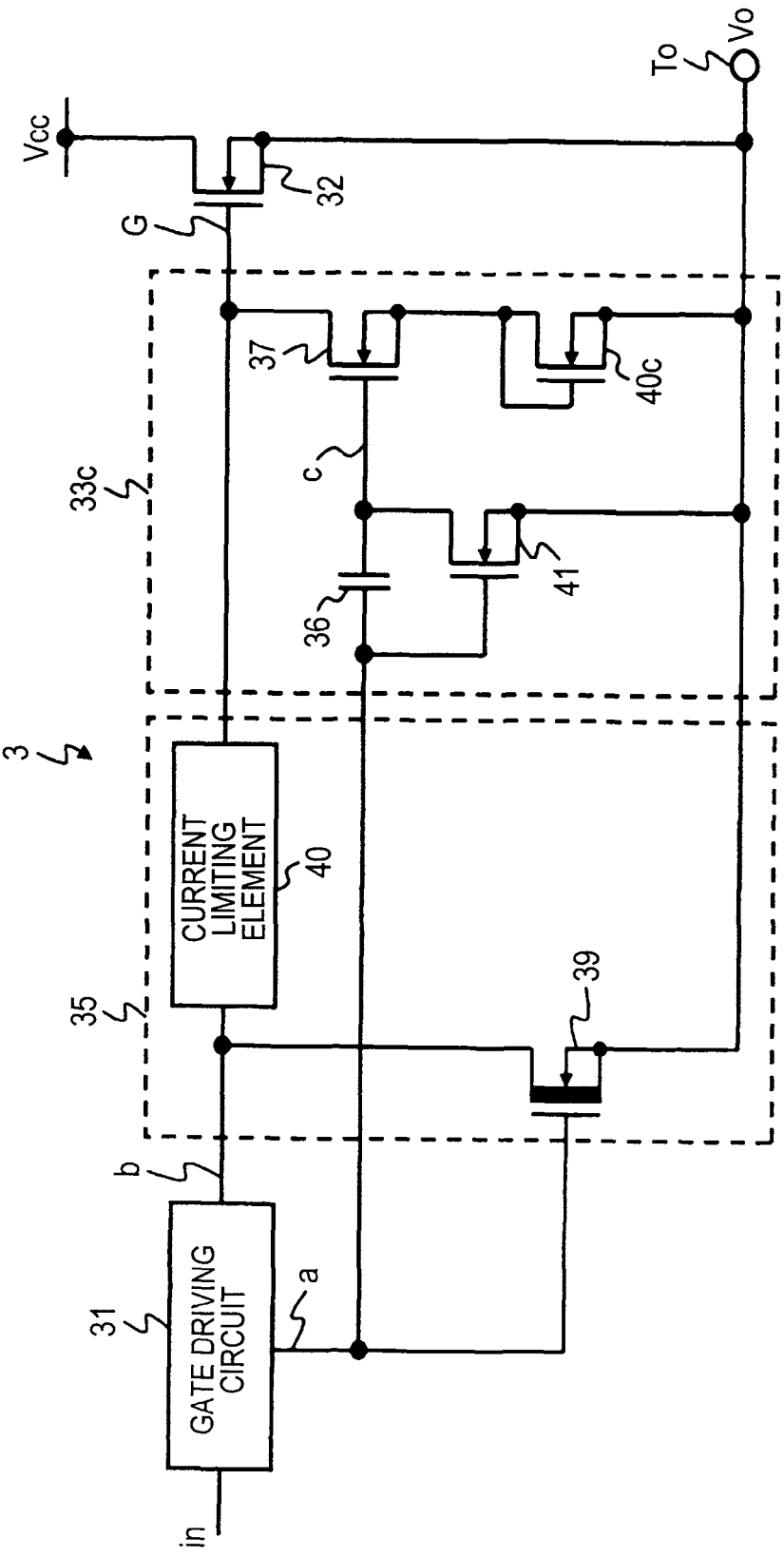
FIG. 4 is a drawing illustrating a power supply control circuit according to a third embodiment of the present invention.

FIG. 4 illustrates a circuit diagram of a power supply control circuit 3 according to a third embodiment of the present invention. As compared with the power supply control circuit 1 illustrated in FIG. 1, the power supply control circuit 3 illustrated in FIG. 4 comprises a discharge circuit 33c instead of the discharge circuit 33a. The discharge circuit 33c comprises a transistor 37, a discharge cutoff circuit 40c, a capacitor 36, and a transistor 41. An N-channel MOS transistor 40c is used as the discharge cutoff circuit 40c. As for the transistor 40c, a gate and a drain are coupled in common to a source of the transistor 37, and a source is coupled to a source of the output transistor 32. The other circuit configuration is the same as that of the circuit illustrated in FIG. 1; therefore, the explanation thereof is omitted.

In the second embodiment, a threshold voltage of whether or not to cut off the first discharge path is adjusted as a function of the number of transistors 40b1-40bn. On the other hand, in the present embodiment, a threshold voltage of whether or not to cut off the first discharge path is adjusted by employing the transistor 40c which possesses a threshold voltage almost same as that of the output transistor. Thereby, the power supply control circuit 3 can cut off the first discharge path, when the gate voltage G of the output transistor 32 falls further to the neighborhood of the power supply voltage Vcc, at the time of a turn-off. That is, the power supply control circuit 3 according to the present embodiment can shorten a turn-off time as compared with the case of the second embodiment.

Operation of the power supply control circuit 3 illustrated in FIG. 4 is explained using FIG. 2. At time t3, turn-off operation of the output transistor 32 starts. That is, the input signal "in" shifts from a low level to a high level. Thereby, the control signal "a" shifts from a low level to a high level. Concurrently, the output terminal (the another output terminal) of the gate driving circuit 31 which outputs the control signal "b" is set to a high-impedance state.

The transistor 41 is maintained in an off state, since the control signal "a" of a high level is applied to the gate and the output voltage Vo is applied to the source. At this time, the voltage of the control signal "c" becomes a voltage level given by superposing the output voltage Vo to the voltage of the control signal "a." Thereby, the transistor 37 is brought to an on state. Accordingly, a gate charge of the output transistor 32 is discharged at high speed via the transistor 37 and a discharge cutoff circuit 40c. That is, the gate charge of the output transistor 32 is discharged at high speed via the first discharge path.

When the gate voltage G of the output transistor 32 falls nearly to a sum total of the power supply voltage Vcc and a threshold voltage of the transistor 40c, the transistor 40c is brought to an off state, and the first discharge path is cut off. Here, the threshold voltage of the transistor 40c is set up slightly higher than the threshold voltage of the output transistor 32. Thereby, the power supply control circuit 3 can cut off the first discharge path, before the output voltage Vo becomes lower than the power supply voltage Vcc.

Figure 5:
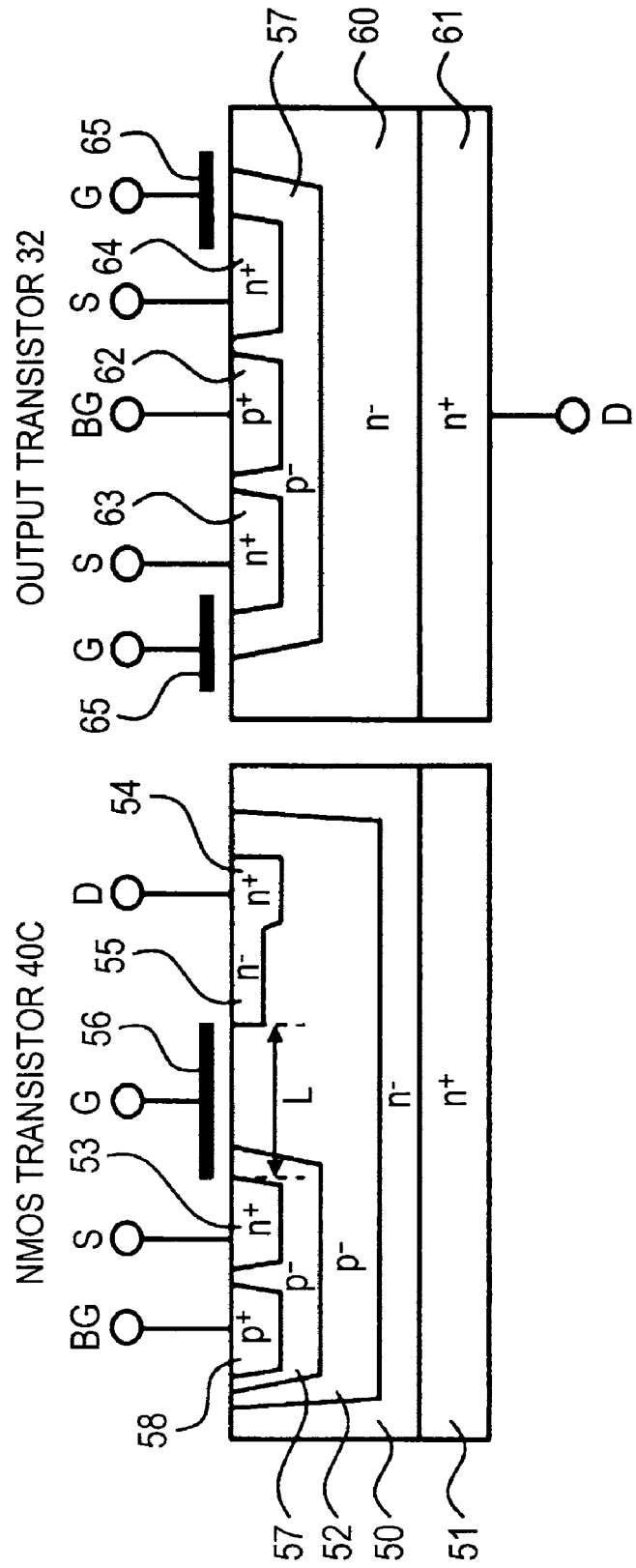
FIG. 5 is a drawing illustrating structure of a transistor which is used for the power supply control circuit according to the third embodiment of the present invention.
Figure 6:
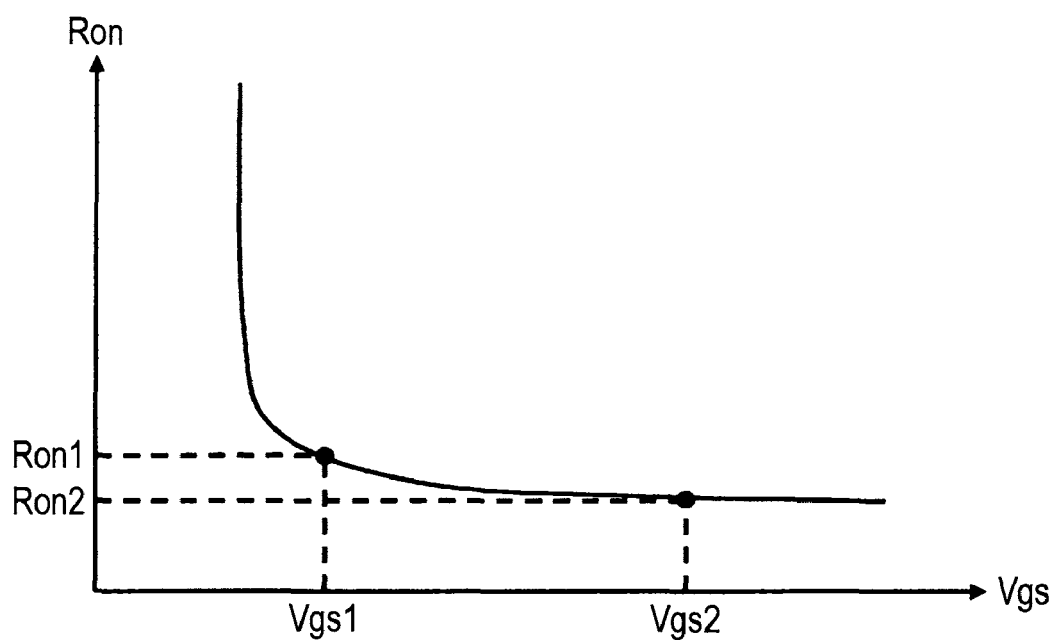
FIG. 6 is a drawing illustrating characteristics of on-resistance vs. gate-to-source voltage of an output transistor.
Figure 7:
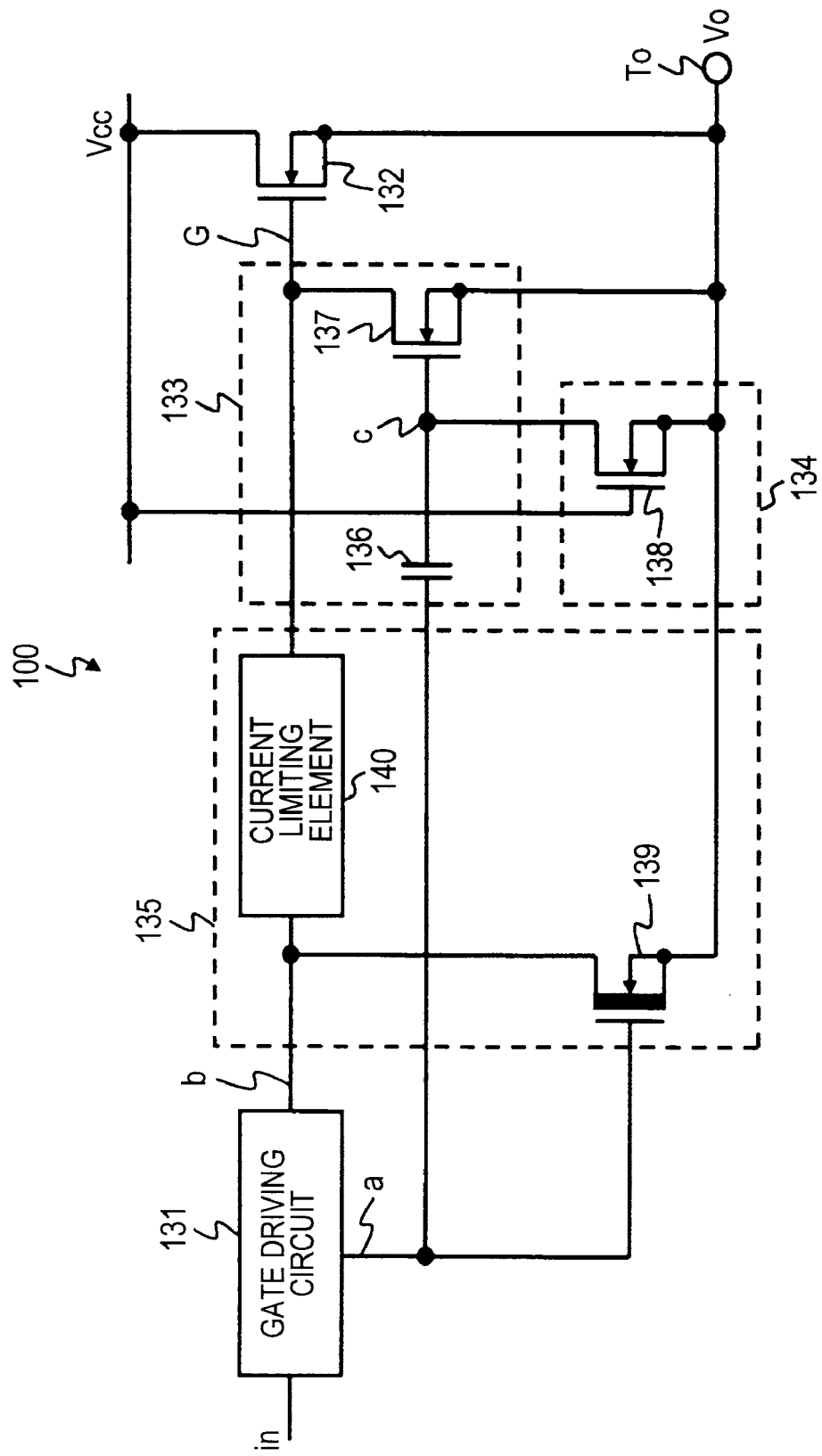
FIG. 7 is a drawing illustrating a power supply control circuit according to the previously existing technology.
Figure 8:
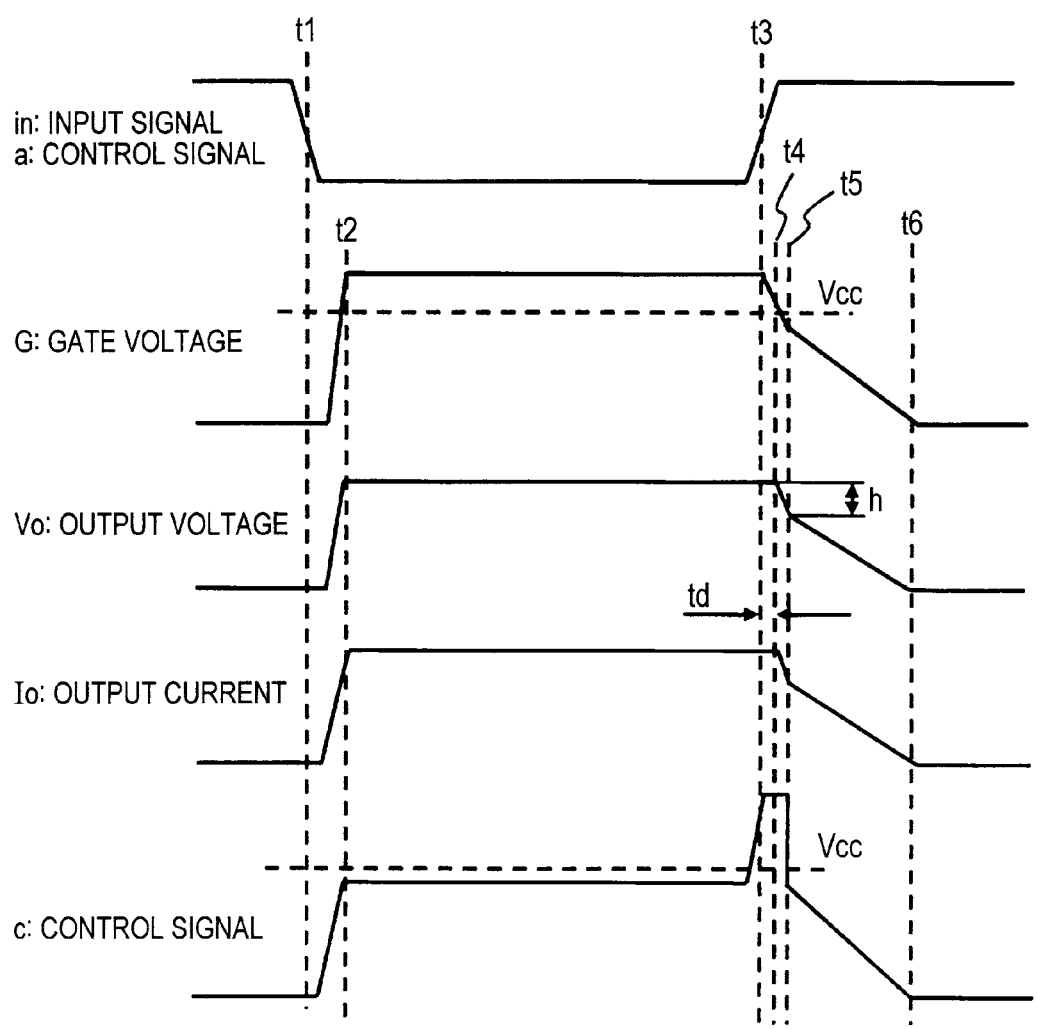
FIG. 8 is a timing chart illustrating operation of the power supply control circuit according to the previously existing technology.

Such a setup is easily realizable by making the same a diffusion layer which determines a threshold voltage of the transistor 40c and the output transistor 32. FIG. 5 illustrates a sectional view of transistor structure of the transistor 40c and the output transistor 32 according to the present embodiment.

The transistor 40c possesses an n⁻ substrate 50. An n⁺ diffusion layer 51 for backside coupling is provided under the n⁻ substrate 50. A first p⁻ diffusion layer 52 is provided over the n⁻ substrate 50. Two n⁺ diffusion layers 53 and 54 are located facing each other over a surface of the first p⁻ diffusion layer 52. The n⁺ diffusion layer (concave diffusion layer) 53 on one side is coupled to a source terminal S. The n⁺ diffusion layer 54 on the other side is coupled to a drain terminal D. An n⁻ diffusion layer 55 of a shallower depth is located between the n⁺ diffusion layers 53 and 54. The n⁻ diffusion layer 55 adjoins the n⁺ diffusion layer 54.

A channel region of length L is provided between the n⁺ diffusion layer 53 and the n⁻ diffusion layer 55. A gate electrode 56 is arranged over the channel. The gate electrode 56 is coupled to a gate terminal G. The n⁺ diffusion layer 53 is enclosed by a second p⁻ diffusion layer 57 with a higher concentration than the first p⁻ diffusion layer 52. The second p⁻ diffusion layer 57 is coupled to a substrate terminal BG via a p⁺ diffusion layer 58.

The output transistor 32 possesses an n⁻ substrate 60. An n⁺ diffusion layer 61 for backside coupling is provided under the n⁻ substrate 60. This n⁺ diffusion layer 61 is coupled to a drain terminal D. The same second p⁻ diffusion layer 57 as employed for the transistor 40c is provided over the n⁻ substrate 60. The second p⁻ diffusion layer 57 is coupled to a substrate terminal BG via a p⁺ diffusion layer 62.

Two n⁺ diffusion layers 63 and 64 are located facing each other over a surface of the second p⁻ diffusion layer 57. The n⁺ diffusion layers 63 and 64 are both coupled to a source terminal S. The p⁺ diffusion layer 62 is located between the n⁺ diffusion layers 63 and 64. A gate electrode 65 is arranged over the channel. The gate electrode 65 is coupled to a gate terminal G.

As exemplified in FIG. 5, the threshold voltages of the transistor 40c and the output transistor 32 are both determined based on the same p⁻ diffusion layer 57. Accordingly, the threshold voltages of both transistors become almost equal. The threshold voltages of both transistors change in a similar manner with respect to manufacturing tolerance.

According to such a circuit configuration, distortion does not occur in a waveform of the output voltage Vo in the power supply control circuit 3 according to the present embodiment, as is the case with the embodiment described above. That is, it is possible for the power supply control circuit 3 to suppress a noise of the output voltage Vo. At the same time, it is possible for the power supply control circuit 3 to make small a slew rate of the output voltage Vo at the time of a turn-off. The other operations are the same as those of the case of the embodiment described above; therefore, the explanation thereof is omitted.

A case where the threshold voltage of the output transistor 32 and the transistor 40c is 2 V respectively for example, is explained. In the present example, when the gate voltage G of the output transistor 32 falls to about the power supply voltage Vcc+2V at the time of a turn-off, the first discharge path is cut off. In this way, in the present embodiment, after the gate voltage G of the output transistor 32 falls further to the neighborhood of the power supply voltage Vcc, as compared with the second embodiment, the first discharge path can be cut off.

As described above, at the time of a turn-off, each of the power supply control circuits according to the above-described embodiments discharges the gate charge of the output transistor 32 at high speed via the first and the second discharge path, when the gate voltage of the output transistor 32 is sufficiently higher than the power supply voltage Vcc. Then, at the time of a turn-off, when the gate voltage G of the output transistor 32 falls to the neighborhood of the power supply voltage Vcc, each of the power supply control circuits according to the above-described embodiments cuts off the first discharge path and discharges the gate charge of the output transistor 32 slowly only via the second discharge path.

According to such circuit configurations, it is possible for each of the power supply control circuits according to the above-described embodiments to shorten time (delay time td) after starting the turn-off operation (time t3) until the output voltage Vo starts to change (time t5), even when the gate voltage of the output transistor 32 is elevated to a voltage sufficiently higher than the power supply voltage Vcc. That is, the turn-off time (from time t3 to time t7) can be shortened. Here, each of the power supply control circuits according to the above-described embodiments cuts off the first discharge path, before the output voltage Vo becomes lower than the power supply voltage Vcc. Accordingly, in the power supply control circuits according to the above-described embodiments, distortion does not occur in a waveform of the output voltage Vo, in contrast to the previously existing technology. Thereby, it is possible for the power supply control circuits according to the above-described embodiments to suppress a noise of the output voltage Vo. At the same time, it is possible for the power supply control circuits according to the above-described embodiments to make small a slew rate of the output voltage Vo at the time of a turn-off.

The present invention is not restricted to the above-described embodiments, however, suitable modifications and alterations may occur depending on design requirements and other factors insofar as they are within the scope of the gist. In the above-described embodiments, the case where a resistor is employed as the current limiting element 40 is exemplified; however, other alternations may be possible. For example, a constant current element formed by a depletion-type N-channel MOS transistor of which a gate and a source are coupled may be employed.

What is claimed is:

1. A power supply control circuit comprising:
   an output transistor of an N-channel type provided between a power supply line and an output terminal;
   a gate driving circuit generating a control signal for controlling on/off of the output transistor based on an external input signal;
   a first discharge switch provided between a gate and a source of the output transistor and, when turning off the output transistor, operable to discharge a charge stored in the gate of the output transistor based on the control signal;
   a second discharge switch provided between the gate and the source of the output transistor and, when turning off the output transistor, operable to discharge a charge stored in the gate of the output transistor more slowly than the first discharge switch based on the control signal; and
   a discharge cutoff circuit coupled to the first discharge switch in series and, in the case of turning off the output transistor, operable to cut off discharging a charge stored in the gate of the output transistor, when a gate voltage of the output transistor falls to a prescribed voltage level which is larger than the sum of a voltage of the power supply line and a threshold voltage of the output transistor.

2. The power supply control circuit according to claim 1, wherein, in the case of turning off the output transistor, the discharge cutoff circuit stops discharging a charge stored in the gate of the output transistor before the voltage of the output terminal falls lower than the voltage of the power supply line.

3. The power supply control circuit according to claim 1, wherein the discharge cutoff circuit is a Zener diode.

4. The power supply control circuit according to claim 1, wherein the discharge cutoff circuit is a diode-connected N-channel MOS transistor.

5. The power supply control circuit according to claim 4, wherein, in an N-channel MOS transistor acting as the discharge cutoff circuit, a source region is formed of the same diffusion layer as a source region of the output transistor.

6. The power supply control circuit according to claim 1, wherein the discharge cutoff circuit comprises a plurality of diode-connected N-channel MOS transistors arranged in series.

7. The power supply control circuit according to claim 1, wherein the first discharge switch is an N-channel MOS transistor, and
wherein the power supply control circuit further comprises a bootstrap circuit operable to control supply of a charge to a gate of the first discharge switch based on the control signal.

8. The power supply control circuit according to claim 1, wherein the second discharge switch is a depletion-type N-channel MOS transistor of which on/off is controlled based on the control signal.

* * * * *